(12) United States Patent
Ito et al.

(10) Patent No.: US 6,667,611 B2
(45) Date of Patent: Dec. 23, 2003

(54) PULSE SIGNAL GENERATOR, COIL BOBBIN FOR THE GENERATOR, AND METHOD OF MAKING THE COIL BOBBIN

(75) Inventors: Tomoaki Ito, Tokyo (JP); Masami Tanaka, Tokyo (JP); Tadashi Kubota, Tokyo (JP); Yasuhiro Masuzaki, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 145 days.

(21) Appl. No.: 09/983,924

(22) Filed: Oct. 26, 2001

(65) Prior Publication Data

US 2003/0080739 A1 May 1, 2003

(51) Int. Cl.[7] ........................ H03K 17/95; G01D 5/244; G01B 7/30
(52) U.S. Cl. ............................ 324/207.13; 324/207.25; 29/595
(58) Field of Search ................. 324/207.13, 207.25, 324/207.22; 307/106, 116; 336/110, 198; 29/595, 602.1

(56) References Cited

U.S. PATENT DOCUMENTS

| 4,757,720 A | | 7/1988 | Tanaka |
| 5,818,226 A | * | 10/1998 | Aizawa ........................ 336/198 |
| 6,084,406 A | | 7/2000 | James et al. |
| 6,160,322 A | * | 12/2000 | Gotoh et al. ................. 307/106 |

FOREIGN PATENT DOCUMENTS

| JP | 10339662 A | | 12/1998 | |
| JP | 11-325528 | * | 11/1999 | ............ 324/207.13 |
| JP | 2000 221069 A | | 8/2000 | |

* cited by examiner

Primary Examiner—Walter E. Snow
(74) Attorney, Agent, or Firm—Kanesaka & Takeuchi

(57) ABSTRACT

A pulse signal generator comprises a pair of magnets (3a, 3b) for producing a magnetic field, a magnetic element wire (5) provided in the magnetic field and capable of producing large Barkhausen jumps, a wire coil (2) provided around the magnetic element wire (5) to output a pulse signal. The magnetic element wire (5) is embedded in a coil bobbin (6) as a unit.

10 Claims, 2 Drawing Sheets

PULSE SIGNAL GENERATOR, COIL BOBBIN FOR THE GENERATOR, AND METHOD OF MAKING THE COIL BOBBIN

BACKGROUND OF THE INVENTION

1. Field of the Invention

The present invention relates to a pulse signal generator, a coil bobbin for the pulse signal generator and a method of making the coil bobbin.

2. Description of the Related Art

A pulse signal generator has been used to provide a pulse signal responsive to the position or speed of a moving object or a variety of operations. One example is a rotation detector that uses an electromagnetic/optical pick-up or Hole/magnetic reluctance element. The electromagnetic system, however, suffers from low output for zero-to-low speed rotations. The optical pick-up system requires a broadband d-c amplifier and a dust-proof structure. The Hole/reluctance system needs a plurality of elements and an amplifier. Some elements of the optical pick-up/Hole/reluctance system is too sensitive to temperatures to be used in the atmosphere that experiences large temperature changes.

Thus, these rotation detectors cannot detect the position or speed of a crankshaft or camshaft for an automobile engine for very low to high speed rotations. In addition, they are not suitable for use in the atmosphere in which they are exposed to large temperature changes or noise.

Japanese patent application Kokai Nos. 2000-101400 and 2000-101401 disclose pulse signal generators that use a magnetic element wire capable of producing large Barkhausen jumps as a detecting element from very low to high speed rotations. These pulse signal generators solves the aforementioned problems but needs further improvements for use in automobiles. The improvements include easy assembly, easy connection to the equipment that uses the pulse signal, the increased S/N ratio, and the increased load capacity, depending on the application.

SUMMARY OF THE INVENTION

Accordingly, it is an object of the invention to provide a pulse signal generator capable of solving the aforementioned problems and suitable for automobile application, a coil bobbin for the pulse signal generator, and a method of making the coil bobbin.

According to one aspect of the invention there is provided a pulse signal generator comprising a unit for generating a magnetic field, said means including at least one magnet; a magnetic element wire provided in said magnetic field and capable of producing large Barkhausen jumps; a coil bobbin molded integrally with said magnetic element wire and a pair of output terminals as a unit; and a wire coil provided around said coil bobbin and responsive to said large Barkhausen jumps to output a pulse signal across said output terminals.

According to another aspect of the invention there is provided a coil bobbin for a pulse signal generator including at least one magnet for generating a magnetic field, a magnetic element wire provided in said magnetic field and capable of producing large Barkhausen jumps, a wire coil provided around said magnetic element wire and responsive to said large Barkhausen jumps to output a pulse signal across a pair of output terminals, said coil bobbin comprising a coil section molded integrally with said magnetic element wire and a base section molded integrally with said terminals; said terminals each having a coil connection portion to be connected to said wire coil and a circuit connection portion to be connected to an outside circuit; said wire coil wound around said coil section, with opposite ends thereof connected to said coil connection portions.

According to still another aspect of the invention there is provided a method of making a coil bobbin for a pulse signal generator which includes a magnet for generating a magnetic field, a magnetic element wire provided in said magnetic field and capable of producing large Barkhausen jumps, and a wire coil provided around said magnetic element wire to generate a pulse signal across a pair of output terminals, said method comprising the steps of integrally molding a coil bobbin having a coil section around which said wire coil is wound and a base section with a through-hole provided near its front end such that said magnetic element wire runs through said coil section to said base section past said through-hole; and cutting off a portion of said magnetic element wire that lies in said through-hole.

According to an embodiment of the invention, the coil bobbin further comprises a flange section to form a reinforcing portion between said flange section and said base section, said wire coil wound around said coil section in a single layer but in a plurality of layers around said reinforcing and coil connection portions.

According to another embodiment of the invention, the flange section has a notch for facilitating transition of said wire coil from said plurality of layers to said single layer.

According to still another embodiment of the invention, the base section has a through-hole near a front end thereof, enabling to cut off a portion of said magnetic element wire embedded in said coil bobbin that lies in said through-hole.

According to yet another embodiment of the invention, the coil bobbin further comprises a tip section, said tip and base sections each having a flat face for positioning said magnet.

DESCRIPTION OF THE PREFERRED EMBODIMENTS

The invention will now be described by way of example with reference to the accompanying drawings.

Figure 1:
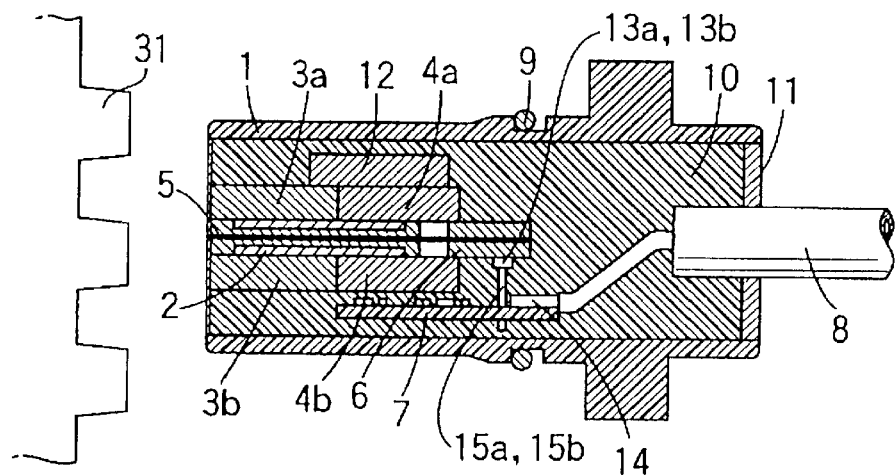
FIG. 1 is a sectional view of a pulse signal generator according to an embodiment of the invention.

In FIG. 1, a pulse signal generator comprises an outer case 1 made of a plastic material, a detecting assembly including a magnetic element wire 5 capable of producing large Barkhausen jumps and a coil 2 responsive to the large Barkhausen jumps to generate a sequence of electric pulses, and a waveform shaping circuit board 7 for shaping a waveform of the electric pulses to output a pulse signal. The detecting assembly and the waveform shaping circuit board 7 are embedded in the outer case 1 as a unit. The detecting assembly is the same as those of JP 2000-101400 and 2000-101401 in principle but different from those in structure; that is, it comprises a bobbin 6 surrounding the magnetic element wire 5, the coil 2 wound around the bobbin 6, a pair of magnet-yoke combinations 3a–4a and 3b–4b provided on opposite sides of the coil 2, and an adjusting yoke 12 provided beside the magnet-yoke combination 3a–4a. A pair of output terminals 13a and 13b for the coil 2 extend laterally from opposite sides of a rectangular rear section of the bobbin 6. According to the embodiment, it is easy to assemble the detecting assembly composed of the coil bobbin 6, the magnet-yoke combinations 3a–4a and 3b–4b, and the adjusting yoke 12.

The waveform shaping circuit board 7 is a printed circuit board on which the waveform shaping circuit is mounted. It comprises a pair of input terminals 15a and 15b to be connected to the output terminals 13a and 13b of the coil bobbin 6 and an output terminal 14 to be connected to a cable 8 of the equipment that make use of the pulse signal. A filler 10 is filled in the outer case 1 to fix the detecting assembly, the waveform shaping circuit board 7, and the termination of the cable 8, and a sealing agent 11 is applied to the outer case 1 from which the cable 8 is pulled out. An O-ring 9 is provided around the outer case 1 to keep airtight the joint between the pulse signal generator and the equipment.

In operation, consider that the object or toothed wheel rotates in step with an automobile engine, for example, in the vicinity of the magnets 3a and 3b and the magnetic element wire 5. Every time a tooth 31 of the toothed wheel passes through the vicinity of the magnets 3a and 3b and the magnetic element wire 5, the magnetic field upon the magnetic element wire 5 changes so that the magnetic element wire 5 produces a large Barkhausen jump, which in turn produces an electric pulse across the coil 2. This electric pulse is rectified and output as a pulse signal at the output terminals 14 by the waveform shaping circuit on the circuit board 7. The coil bobbin 6 integrated with the magnetic element wire 5 and the output terminals 13a and 13b of the coil as a unit will be described with reference to FIGS. 2–6.

Figure 2:
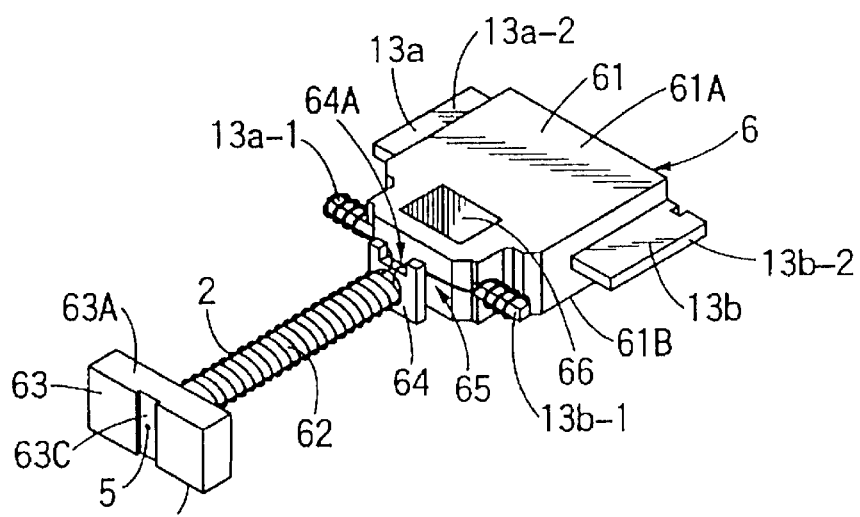
FIG. 2 is a perspective view of a coil bobbin for the pulse signal generator.
Figure 3:
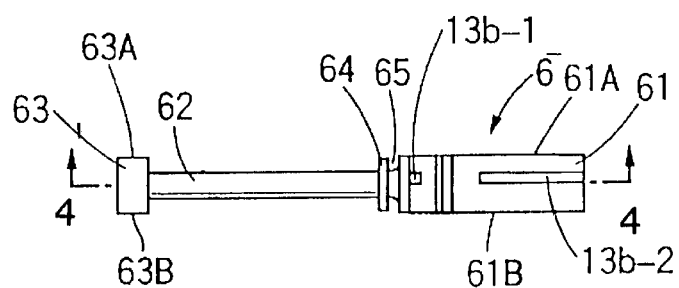
FIG. 3 is a side view of the coil bobbin from which the wire coil is removed.
Figure 4:
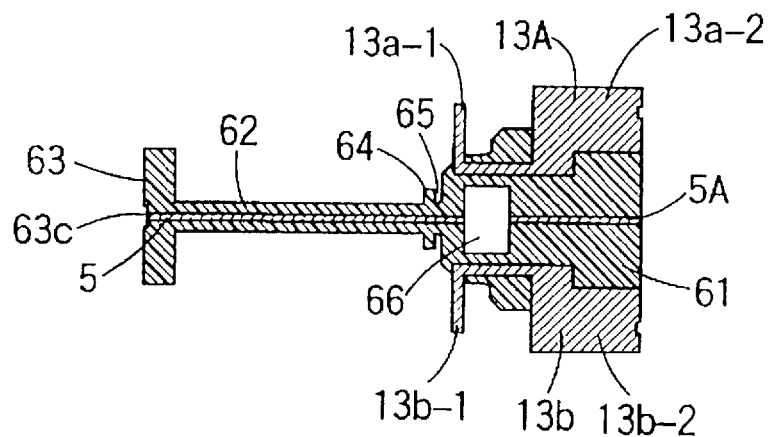
FIG. 4 is a sectional view taken along line 4—4 of FIG. 3.

In FIGS. 2–4, the coil bobbin 6 includes a base section 61, a coil section 62, a tip section 63, and a flange section 64 for forming a reinforcing winding portion 65 in front of the base section 61. A rectangular through-hole 66 is provided in the base section 61 near its front end. A notch 64A is provided in the top side of the flange section 64.

As best shown in FIG. 4, the coil bobbin 6 is molded of an insulative material, such as a plastic, together with the magnetic element wire 5 running through the coil section 62, the rectangular through-hole 66, and the base section 61, and the output terminals 13a and 13b on opposite sides of the base section 61 as a unit. Each of the output terminals 13a and 13b has a coil connection portion 13a-1 or 13b-1 and a circuit connection portion 13a-2 or 13b-2 extending outwardly from the opposite sides of the base section 61.

The function of the rectangular through-hole 66 is as follows. In order to integrally mold the magnetic element wire 5, it is necessary to provide a wire holder outside the mold. The optimal length of the magnetic element wire is shorter than the whole length that includes the extended portion held in the wire holder so that it is necessary to cut the magnetic element wire to the optimal length in the subsequent process step. The rectangular through-hole 66 enables to cut the magnetic element wire at this point. In FIG. 4, the portion of the magnetic element wire that crosses the rectangular through-hole 66 has been cut off. The portion from the tip section 63 to the front end of the base section 61 is the magnetic element wire 5 that is necessary for the operation of the pulse signal generator. By changing the position of the rectangular through-hole 66, it is possible to provide the optimal length of the magnetic element wire.

As best shown in FIG. 4, a shallow indentation 63C is provided in the front face of the tip section 63 so that the front end of the magnetic element wire 5, which is terminated in flush with the bottom face of the indentation 63C, does not project from the front face of the tip section 63.

How to make the coil 2 around the integrated bobbin 6 will be described with reference to FIG. 2. An end portion of a wire is wound around the coil connection portion 13a-1 of the terminal 13a in a plurality of layers (three layers, for example) and around the reinforcing winding portion 65 in a plurality of layers (three layers, for example). Then, the wire is put through the notch 64A of the flange section 64 and wound around the coil section 62 up to the tip section 63 and then back to the flange section 64 by a predetermined number of turns. Then, the wire is put through the notch 64A of the flange section 64 and wound around the reinforcing portion 65 in a plurality of layers and finally the coil connection portion 13b-1 of the terminal 13b in a plurality of layers. The windings on the coil connection portions 13a-1 and 13b-1 are soldered to complete the coil 2. Conversely, the winding may be started from the coil connection portion 13b-1 and terminated at the coil connection portion 13a-1.

The front and rear ends of the coil are wound (by three turns, for example) around the coil connection portions for reinforcing because it is likely that stresses are applied to the coil between the coil connection portions 13a-1 and 13b-1, and the flange section 64. The multi-layer windings at the start and end portions and the single-layer winding for the body portion of the coil 2 enables to reinforce only the vulnerable area and minimize the diameter of the coil 2 itself.

As best shown in FIG. 3, the base and tip sections 61 and 63 of the coil bobbin 6 have flat top and bottom faces 61A and 61B, and 63A and 63B, respectively. As best shown in FIG. 1, by placing the magnet 3a or yoke 4a on the flat top face 63A or 61A of the tip or base section 63 or 61 and the magnet 3b or yoke 4b on the flat bottom face 63B or 61B of the tip or base section 63 or 61 it is made easy to position the magnet 3a and/or yoke 4a and magnet 3b and/or yoke 4b in place. By specifying the respective distances between the magnetic element wire 5 and the respective flat faces 63A, 63B, 61A, and 61B, it is possible to balance the magnetic field upon the magnetic element wire 5 for producing good large Barkhausen jumps.

Figure 5:
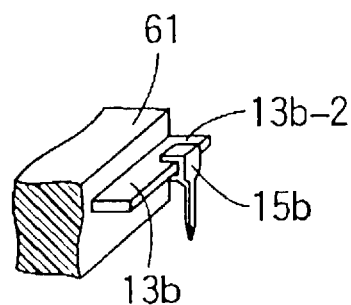
FIG. 5 is a perspective view of part of the coil bobbin.

In FIG. 5, an input terminal 15b of the waveform shaping circuit is connected to the circuit connection portion 13b-2 of the output terminal 13b. The input terminal 15b extends upwardly from the circuit board 7 and holds the circuit connection portion 13b-2 between the upper and lower fingers for electrical and mechanical connection. Similarly, an input terminal 15a (not shown) is provided for the output terminal 13a.

Figure 6:
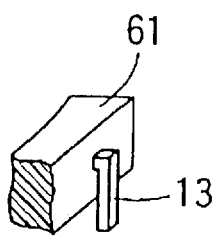
FIG. 6 is a perspective view of part of a coil bobbin according to another embodiment of the invention.

In FIG. 6, an output terminal or circuit connection portion 13 extends downwardly from the base section 61 for direct connection with the waveform shaping circuit.

The magnetic element wire, the output terminals, and the coil are integrated with the bobbin as a unit so that it is easy to connect the coil and the output terminals, and the terminals and the waveform shaping circuit, facilitating the assembly of the pulse signal generator. The upper and bottom faces of the tip and base sections of the coil bobbin are flattened so as to assure the accurate and stable positioning of the magnets. The magnetic element wire is integrated with the coil bobbin as a unit so that it is possible to keep the position of the magnetic element wire.

By specifying the position of the magnet and yoke with the upper and lower flat faces of the coil bobbin, it is made easy to adjust the relative position between the magnetic element wire, and the magnets and yokes for producing good large Barkhausen jumps. The rectangular through-hole in the base section makes it easy to provide the optimal length of the magnetic element wire. By providing multiple-layer stop windings only at the start and end of a single-layer coil, it is possible to reinforce the coil against impacts, etc., without increasing the diameter of the coil.

What is claimed is:

1. A pulse signal generator comprising:
   means for generating a magnetic field, said means including at least one magnet;
   a magnetic element wire provided in said magnetic field and capable of producing large Barkhausen jumps;
   a wire coil provided around said magnetic element wire and generating pulse signals in response to said Barkhausen jumps;
   a pair of terminals, each having a coil connection portion to be connected to said wire coil and a circuit connection portion to be connected to an outside circuit; and
   a coil bobbin having a coil section molded integrally with said magnetic element wire, a base section molded integrally with said terminals such that said coil and circuit connection portions project from said base section, and a tip section, wherein each of said tip and base sections has flat top and bottom faces for positioning said magnet.

2. The pulse signal generator according to claim 1, wherein said wire coil is wound around said coil section of said coil bobbin with opposite ends thereof connected to said coil connection portions of said terminals.

3. The pulse signal generator according to claim 2, wherein said coil bobbin further comprises a flange section to form a reinforcing portion between said flange section and said base section, and said wire coil is wound around said coil section in a single layer but in a plurality of layers around said reinforcing and coil connection portions.

4. The pulse signal generator according to claim 3, wherein said flange section has a notch for facilitating transition of said wire coil from said plurality of layers to said single layer.

5. The pulse signal generator according to claim 1, wherein said base section has a through-hole near a front end thereof to cut off a portion of said magnetic element wire that lies in said thorough-hole.

6. A coil bobbin for a pulse signal generator including at least one magnet for generating a magnetic field, a magnetic element wire provided in said magnetic field and capable of producing large Barkhausen jumps, a wire coil provided around said magnetic element wire and generating pulse signals in response to said large Barkhausen jumps, and a pair of terminals each having a coil connection portion to be connected to said wire coil and a circuit connection portion to be connected to an outside circuit, said coil bobbin comprising:
   a coil section molded integrally with said magnetic element wire;
   a base section molded integrally with said terminals such that said coil and circuit connection portions project from said base section; and
   a tip section, said tip and base sections each having flat top and bottom faces for positioning said magnet;
   said wire coil wound around said coil section with opposite ends thereof connected to said coil connection portions of said terminals.

7. The coil bobbin according to claim 6, which further comprises a flange section to form a reinforcing portion between said flange section and said base section, and said wire coil is wound around said coil section in a single layer but in a plurality of layers around said reinforcing and coil connection portions.

8. The coil bobbin according to claim 7, wherein said flange section has a notch for facilitating transition of said wire coil from said plurality of layers to said single layer.

9. The coil bobbin according to claim 6, wherein said base section has a through-hole near a front end thereof to cut off a portion of said magnetic element wire that lies in said thorough-hole.

10. A method of making a coil bobbin for a pulse signal generator which includes a magnet for generating a magnetic field, a magnetic element wire provided in said magnetic field and capable of producing large Barkhausen jumps, a wire coil provided around said magnetic element wire and generating pulse signals in response to said large Barkhausen jumps, and a pair of terminals to be connected to said wire coil and an outside circuit, said method comprising the steps of:
   integrally molding a coil bobbin having a coil section around which said wire coil is wound and a base section with a through-hole provided near its front end such that said magnetic element wire runs through said coil section to said base section past said though-hole and said terminals are attached to said base section; and
   cutting off a portion of said magnetic element wire that lies in said though-hole.

* * * * *